(12) United States Patent
Iwamuro et al.

(10) Patent No.: US 9,614,030 B2
(45) Date of Patent: Apr. 4, 2017

(54) VERTICAL HIGH VOLTAGE SEMICONDUCTOR APPARATUS AND FABRICATION METHOD OF VERTICAL HIGH VOLTAGE SEMICONDUCTOR APPARATUS

(71) Applicants: FUJI ELECTRIC CO., LTD., Kawasaki-shi, Kanagawa (JP); NATIONAL INSTITUTE OF ADVANCED INDUSTRIAL SCIENCE AND TECHNOLOGY, Tokyo (JP)

(72) Inventors: Noriyuki Iwamuro, Tsukuba (JP); Shinsuke Harada, Tsukuba (JP); Yasuyuki Hoshi, Matsumoto (JP); Yuichi Harada, Matsumoto (JP)

(73) Assignees: FUJI ELECTRIC CO., LTD., Kawasaki-shi (JP); NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 13 days.

(21) Appl. No.: 14/388,745

(22) PCT Filed: Mar. 29, 2013

(86) PCT No.: PCT/JP2013/059777
§ 371 (c)(1),
(2) Date: Sep. 26, 2014

(87) PCT Pub. No.: WO2013/147276
PCT Pub. Date: Oct. 3, 2013

(65) Prior Publication Data
US 2015/0076519 A1    Mar. 19, 2015

(30) Foreign Application Priority Data

Mar. 30, 2012 (JP) ................. 2012-081580

(51) Int. Cl.
*H01L 29/15* (2006.01)
*H01L 29/06* (2006.01)
(Continued)

(52) U.S. Cl.
CPC ........ *H01L 29/0634* (2013.01); *H01L 29/045* (2013.01); *H01L 29/1095* (2013.01);
(Continued)

(58) Field of Classification Search
CPC .......... H01L 29/1608; H01L 29/66068; H01L 29/7802; H01L 21/02529; H01L 21/02378; H01L 2924/13091; H01L 21/02433
See application file for complete search history.

(56) References Cited

U.S. PATENT DOCUMENTS 7,118,970 B2 * 10/2006 Das ..................... H01L 29/1095
257/328
7,923,320 B2    4/2011 Ryu
(Continued)

FOREIGN PATENT DOCUMENTS

| JP | 2009-099714 A | 5/2009 |
| JP | 2011-258635 A | 12/2011 |
| WO | 2004/036655 A1 | 4/2004 |

OTHER PUBLICATIONS

Notification of Transmittal of Translation of the International Preliminary Report on Patentability (Form PCT/IB/338) of International Application No. PCT/JP2013/059777 mailed Oct. 9, 2014 with Forms PCT/IB/373, PCT/ISA/237 and PCT/IB/326 (13 pages).
(Continued)

*Primary Examiner* — Cuong Q Nguyen
*Assistant Examiner* — Nishath Yasmeen
(74) *Attorney, Agent, or Firm* — Westerman, Hattori, Daniels & Adrian, LLP

(57) ABSTRACT

A silicon carbide vertical MOSFET includes an N-counter layer of a first conductivity type formed in a surface layer other than a second semiconductor layer base layer selectively formed in a low concentration layer on a surface of the substrate, a gate electrode layer formed through a gate insulating film in at least a portion of an exposed portion of a surface of a third semiconductor layer of a second conductivity type between a source region of the first conductivity type and the N-counter layer of the first conductivity type, and a source electrode in contact commonly with surfaces of the source region and the third semiconductor layer. Portions of the second conductivity type semiconductor layer are connected with each other in a region beneath the N-counter layer.

9 Claims, 11 Drawing Sheets

(51) Int. Cl.
| | | |
|---|---|---|
| *H01L 29/66* | (2006.01) | |
| *H01L 29/739* | (2006.01) | |
| *H01L 29/78* | (2006.01) | |
| *H01L 29/10* | (2006.01) | |
| *H01L 29/16* | (2006.01) | |
| *H01L 29/04* | (2006.01) | |

(52) U.S. Cl.
CPC .... *H01L 29/1608* (2013.01); *H01L 29/66068* (2013.01); *H01L 29/66333* (2013.01); *H01L 29/7395* (2013.01); *H01L 29/7802* (2013.01); *H01L 29/0696* (2013.01)

(56) References Cited

U.S. PATENT DOCUMENTS

2006/0057796 A1* 3/2006 Harada ............... H01L 21/0465
438/199
2009/0096020 A1 4/2009 Yamanobe

OTHER PUBLICATIONS

International Search Report dated Jun. 11, 2013, issued in corresponding application No. PCT/JP2013/059777.
Fujihira, Tatsuhiko, "Theory of Semiconductor Superjunction Devices", Jpn. J. Appl. Phys., Oct. 1997, vol. 36, Part 1, No. 10, pp. 6254-6262.
Deboy, G., et al., "A new Generation of high voltage MOSFETs breaks the limit line of silicon", IEEE IEDM, 1998, pp. 683-685.
Shenai, Krishna, et al., "Optimum Semiconductors for High-Power Electronics", IEEE Transactions on Electron Devices, Sep. 1989, vol. 36, pp. 1811-1822.

* cited by examiner

FIG.5
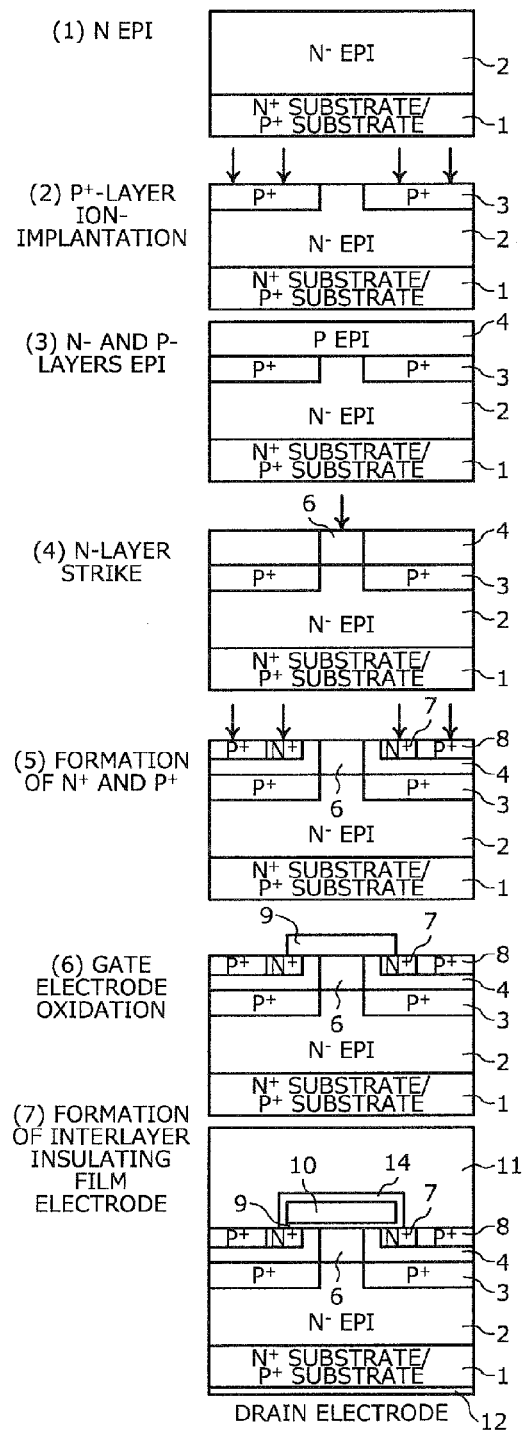
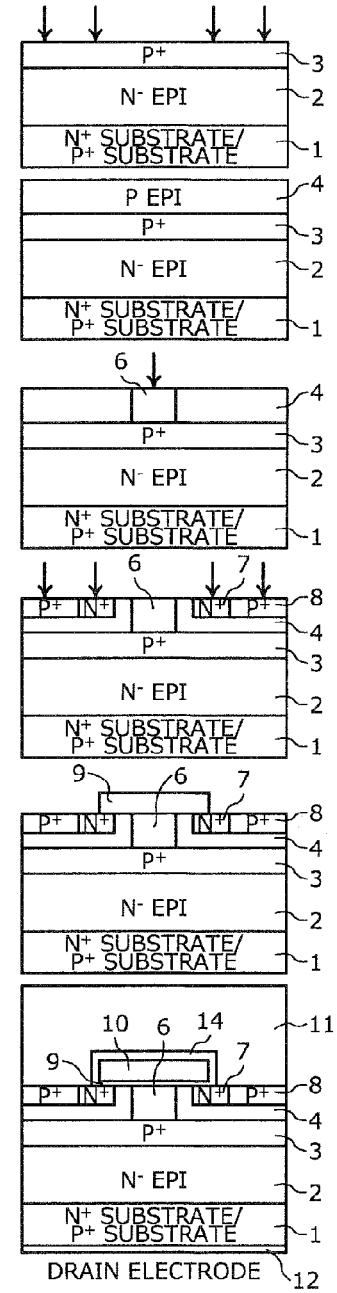
(a) CROSS-SECTIONAL DIAGRAM OF PORTION WHOSE P+-LAYERS ARE NOT COUPLED WITH EACH OTHER
(b) CROSS-SECTIONAL DIAGRAM OF PORTION WHOSE P+-LAYERS ARE COUPLED WITH EACH OTHER

FIG.8

| | PRESENT INVENTION | | | | | CONVENTIONAL TECHNIQUE | |
|---|---|---|---|---|---|---|---|
| | FIRST EXAMPLE | SECOND EXAMPLE | THIRD EXAMPLE | FOURTH EXAMPLE | FIFTH EXAMPLE | CONVENTIONAL SiC MOSFET | Si-IGBT |
| DEVICE WITHSTAND VOLTAGE (RT) | 1450V | 1452V | 1453V | 1455V | 1455V | 880V | 1448V |
| ON-RESISTANCE (RT) | 2.80mΩcm² | 4.21mΩcm² | 2.99mΩcm² | 2.85mΩcm² | 4.33mΩcm² | 2.80mΩcm² | 11.2mΩcm² |
| TURN-OFF LOSS (150°C) | 0.85mJ | 0.86mJ | 0.85mJ | 0.89mJ | 0.90mJ | 0.89mJ | 2.10mJ |
| TURN-ON LOSS (150°C) | 0.90mJ | 0.98mJ | 0.92mJ | 0.90mJ | 0.92mJ | 0.98mJ | 3.10mJ |
| GATE THRESHOLD VALUE (175°C) | 3.2V | 3.2V | 3.3V | 3.2V | 3.3V | 3.2V | 3.9V |
| TURN-OFF WITHSTAND LEVEL (175°C) | >100A | >100A | >100A | >100A | >100A | 20A | >100A |
| LOAD SHORT-CIRCUIT WITHSTAND LEVEL (175°C) | >15μs | >15μs | >15μs | >15μs | >15μs | 3.8μs | 4.8μs |

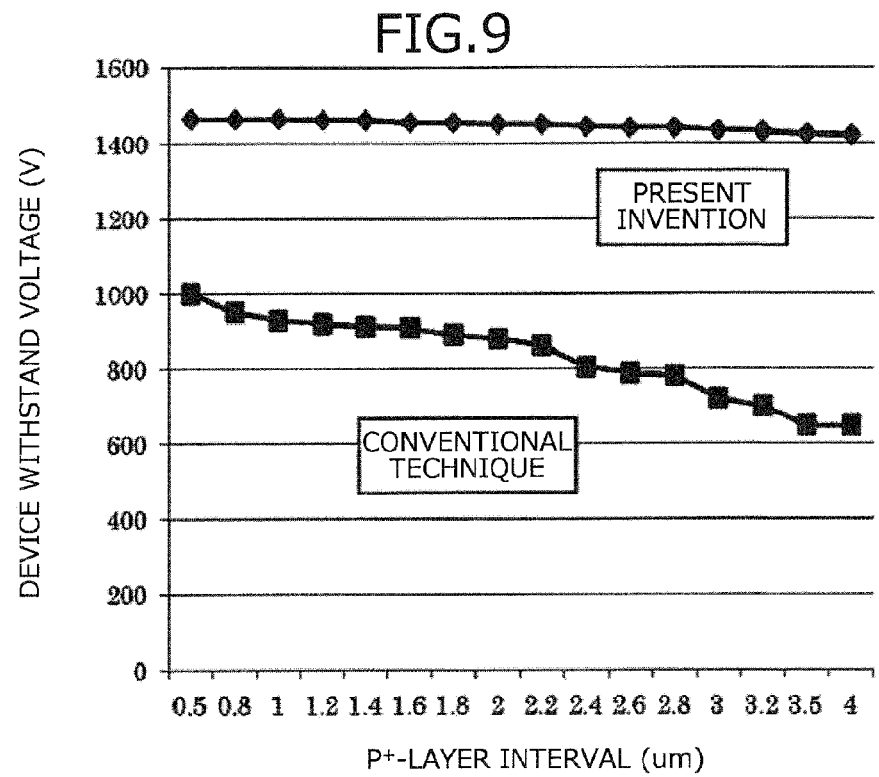
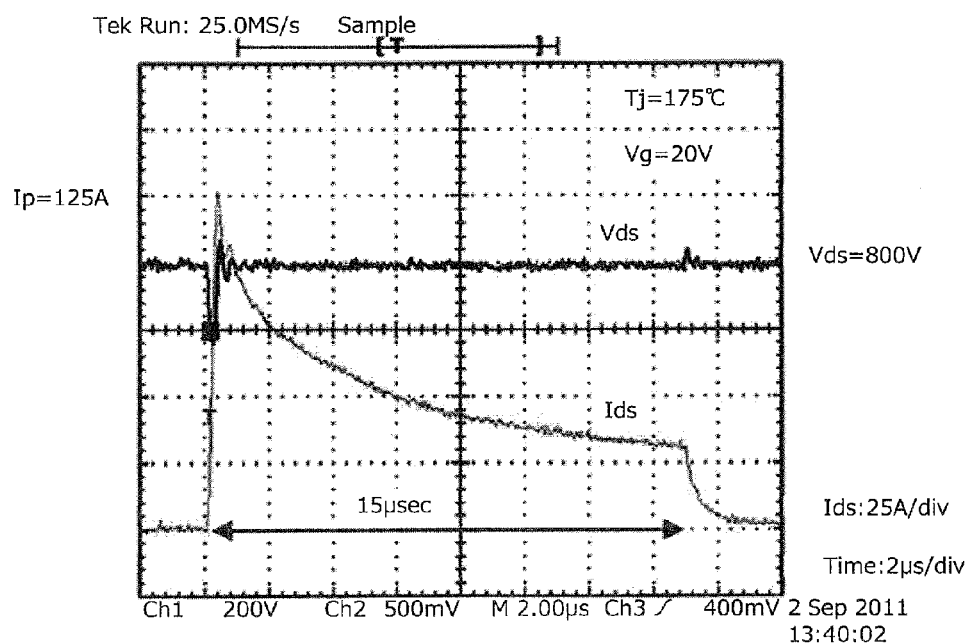

P+-ION-IMPLANTED LAYERS BENEATH
P-CHANNEL (EPI) LAYER ARE COUPLED
BY P+-ION-IMPLANTED LAYER (a) R.T (b) 200°C (a)R.T (b)200°C

VERTICAL HIGH VOLTAGE SEMICONDUCTOR APPARATUS AND FABRICATION METHOD OF VERTICAL HIGH VOLTAGE SEMICONDUCTOR APPARATUS

TECHNICAL FIELD

The present invention relates to a power semiconductor apparatus capable of controlling high current and high voltage, and particularly to a vertical high voltage MOSFET apparatus and an IGBT each using as its semiconductor silicon carbide that is one of wide band gap materials.

BACKGROUND ART

Single crystal silicon (Si) is conventionally used as a material for a power semiconductor device controlling high current and high voltage (a power device). Various types of power semiconductor devices exist and each is used for a purpose suitable therefor. For example, a bipolar transistor and an insulated gate bipolar transistor (IGBT) can respectively handle a high current density but these transistors are incapable of high speed switching. Frequency limits for the bipolar transistor and the IGBT are on the order of several kHz and about 20 kHz, respectively. On the other hand, although a power MOSFET (Metal Oxide Semiconductor field effect transistor) cannot handle high current, this transistor can switch at high speeds up to several MHz.

In the market, demand is strong for a power semiconductor device that can cope with high current and high speed, and efforts have been made to improve the IGBT, the power MOSFET, etc. Therefore, at present, the performance of power devices substantially reaches the theoretical limit decided by materials.

FIG. 1 is an explanatory diagram of a cross-sectional view of a common MOSFET. FIG. 1 depicts a cross-sectional view of a typical (common) MOSFET as a power device capable of coping with a high current and a high speed. In FIG. 1, an epitaxially-formed, low concentration $N^-$-drift layer b is disposed on a front face side of a substrate a. A P-base layer c is further formed in a surface layer on the front face side of the low concentration $N^-$-drift layer b. A high concentration $N^+$-source layer d is selectively formed in the surface layer on the front face side of the P-base layer c. A gate electrode f is formed through a gate insulating film e on the $N^-$-drift layer b, the P-base layer c, and the high concentration $N^+$-source layer d. A drain electrode g is formed on the side of a back face of the substrate a.

A MOSFET has recently attracted attention. FIGS. 2, 3, and 4 are explanatory diagrams depicting a cross-sectional view of the structure of a conventional silicon superjunction MOSFET. FIGS. 2 to 4 depict, as a superjunction MOSFET, a cross-sectional view of the structure of a typical device. The theory of the superjunction MOSFET was reported by Fujihira, in 1997 (see Non-Patent Literature 1 below) and this MOSFET was established as a product called "Cool-MOS" by Deboy, et al, in 1998 (see Non-Patent Literature 2 below). The ON-resistance of the superjunction MOSFET can be improved significantly without degrading the breakdown voltage between the source and the drain by forming a P-layer in a columnar structure in a vertical direction in the $N^-$-drift layer.

Investigations concerning the material from the viewpoint of the power semiconductor device has been conducted. For example, as Shebnai, et al, reported that SiC is excellent with regard to low ON-voltage, high speed, and high temperature properties and therefore, SiC has recently attracted attention especially for next generation power semiconductor devices (see Non-Patent Literature 3 below).

In view of SiC attracting attention for next generation power semiconductor devices, it can be said that SiC is a highly stable material chemically, has a wide band gap of three eV, and can be used very stably for a semiconductor even at high temperatures. Further, since SiC has attracted attention for next generation power semiconductor devices, it can be further said that the critical electric field strength thereof is higher than that of Si by one or more digits.

The material performance of SiC exceeds the material performance limits of silicon and therefore, the use of SiC for power semiconductors is expected, especially for MOSFETs. In particular, there are high expectations related to the low ON-resistance of SiC and for a vertical SiC-MOSFET that has even lower ON-resistance, while maintaining the high breakdown voltage.

Patent Document 1: U.S. Pat. No. 7,923,320
Non-Patent Literature 1: Fujihara, JJAP, vol. 36, Part 1, No. 10, p. 6254, 1997
Non-Patent Literature 2: Deboy, et al, IEEE IEDM 1998, p. 683
Non-Patent Literature 3: Shenai, IEEE Transcation on Electron Devices (Vol. 36, p. 1811), 1989

DISCLOSURE OF INVENTION

Problem to be Solved by the Invention

The SiC-MOSFET formed as described above is expected to be used as a switching device because the SiC-MOSFET has low ON-resistance and can switch at a high speed. For example, the SiC-MOSFET is expected to be used in a power conversion equipment such as a motor control inverter or an uninterruptible power supply (UPS) as a device capable of switching at a high speed while having a low ON-resistance.

SiC is a wide band gap semiconductor material and therefore, as described, the critical electric field strength thereof is high, about 10 times higher than that of Si. Therefore, the ON-resistance of SiC is expected to be sufficiently low. On the other hand, the critical electric field strength of the semiconductor is about 10 times higher than that of Si and therefore, the load of the electric field on the oxide film becomes higher compared to that of a Si device especially when high voltage is applied. Consequently, the critical electric field strength of Si is reached before a high electric field is applied to the oxide film and therefore, the items that are not problematic for a power device using Si become problematic in a power device using SiC having the extremely high critical electric field strength of the semiconductor. Therefore, there is concern that the oxide film will fail sooner.

For example, a high electric field strength is applied to the gate insulating film (the oxide film) of the SiC-MOSFET depicted in FIG. 1, whereby the oxide film forming the gate electrode f is damaged, etc., potentially arising in a serious problem concerning the reliability of the SiC-MOSFET. This fault concerns not only the SiC-MOSFET but also the SiC-IGBT. Regarding the fault, for example, Patent Document 1 above also includes description that care needs to be taken for the electric field strength applied to the gate oxide film in the SiC-MOSFET. However, the material performance of SiC is highly likely to exceed the material performance limit of Si and therefore, application of SiC in power semiconductors, especially, MOSFETs is expected to increase and improvement thereof is also expected.

To solve the conventional problems above, an object of the present invention is to provide a vertical high voltage semiconductor apparatus as a vertical SiC-MOSFET that uses SiC, etc. for the semiconductor material and that can exploit the low ON-resistance of SiC, and to provide a fabrication method of the vertical high voltage semiconductor apparatus that utilizes the low ON-resistance and whose reliability is improved by preventing damage of the oxide film forming the gate electrode even when high voltage is applied.

Means for Solving Problem

To solve the problems above and achieve an object, a vertical high voltage semiconductor apparatus according to the present invention has the following characteristics. A first semiconductor layer (2) having an impurity concentration lower than that of a semiconductor substrate (1) is formed on the semiconductor substrate (1); and a second semiconductor layer (3) of a second conductivity type and having an impurity concentration higher than that of the first semiconductor layer (2), is selectively formed on a surface of the first semiconductor layer (2). A base layer (4) of the second conductivity type is disposed on the first semiconductor layer (2) and the second semiconductor layer (3); and an N-counter layer (6) of the first conductivity type is formed to penetrate the base layer (4) from a surface and reach the first semiconductor layer (2). A gate electrode layer (10) is disposed through a gate insulating film (9) in at least a portion of an exposed portion of a surface of the base layer (4) between the source region (7) and the N-counter layer (6); a source electrode (11) in contact commonly with surfaces of the source region (7) and the base layer (4), and a drain electrode (12) disposed on a back face of the semiconductor substrate (1) are provided. Further, portions of the second semiconductor layer (3) are connected with each other in regions beneath the N-counter layers (6).

In the vertical high voltage semiconductor apparatus according to the invention, portions in each of which the portions of the second semiconductor layer (3) are connected with each other in the region beneath the N-counter layer (6) are separated from a PN-junctions formed by the base layers (4) and the N-counter layers (6).

In the vertical high voltage semiconductor apparatus according to the invention, a semiconductor material of the semiconductor substrate (1) is silicon carbide.

In the vertical high voltage semiconductor apparatus according to the invention, the crystallographic plane indices of the semiconductor substrate (1) is a surface parallel to, or inclined by an angle within 10 degrees with respect thereto, a surface whose crystallographic plane indices are (000-1).

In the vertical high voltage semiconductor apparatus according to the invention, the crystallographic plane indices of the semiconductor substrate (1) is a surface parallel to, or inclined by an angle within 10 degrees with respect thereto, a surface whose crystallographic plane indices are (0001).

To further solve the problems above and achieve an object, a fabrication method of the vertical high voltage semiconductor apparatus according to the present invention has the following characteristics. A process of forming on a semiconductor substrate (1) of a first conductivity type, a first semiconductor layer (2) having an impurity concentration lower than that of the semiconductor substrate (1) is performed. Subsequently, a process of forming selectively on a surface of the first semiconductor layer (2) and using an ion implantation method, a second semiconductor layer (3) of a second conductivity type having an impurity concentration higher than that of the first semiconductor layer (2); and a process of forming a base layer (4) of the second conductivity type on the first semiconductor layer (2) and the second semiconductor layer (3), using an epitaxial growth method is performed. Further, a process of forming a first conductivity type source region (7) selectively in a surface layer of the base layer (4) and forming an N-counter layer (6) of the first conductivity type penetrating the base layer (4) from the surface and reaching the first semiconductor layer (2), using the ion implantation method is performed. The process of forming of the second semiconductor layer (3) includes forming the second semiconductor layer (3) such that portions of the second semiconductor layer (3) are connected with each other in region a beneath the N-counter N-counter layers (6).

For example, in the case of an MOSFET, it suffices to set the conductivity type of the substrate to be the N type and in the case of an IGBT, it suffices to form a P-type collector layer on the back face of the N-type substrate using a technique such as epitaxial growth or ion implantation.

Effect of the Invention

According to the vertical high voltage semiconductor apparatus and the fabrication method of the vertical high voltage semiconductor apparatus of the present invention, in the case of a vertical SiC-MOSFET using SiC, etc. as the semiconductor material, an effect is achieved that reliability is improved by utilizing the low ON-resistance property to prevent damage of the oxide film forming the gate electrode even when high voltage is applied, enabling the low ON-resistance of SiC to be exploited.

BRIEF DESCRIPTION OF DRAWINGS

FIG. 5 is a cross-sectional diagram of fabrication process steps for a SiC-MOSFET of the first example, (a) and (b) respectively depicting cross-sectional diagrams of a portion in which $P^+$-layers are not connected with each other and a portion in which the $P^+$-layers are connected with each other;

FIG. 8 is an explanatory diagram of a result of property comparison evaluation between the SiC-MOSFET of the example according to the present invention and the conventional SiC-MOSFET whose $P^+$-layers are not connected with each other;

FIG. 9 is an explanatory diagram of a result of actual measurement of the device breakdown voltage of the SiC-MOSFET obtained when the width of an N-counter layer 6 was varied;

FIG. 10 is an explanatory diagram of the result of a load short-circuit withstand level test of the first example;

BEST MODE(S) FOR CARRYING OUT THE INVENTION

First Example

A first example of the present invention will be described with reference to FIG. 5. FIG. 5 is a cross-sectional diagram of fabrication process steps for a SiC-MOSFET of the first example. (a) and (b) in FIG. 5 respectively depict cross-sectional diagrams of a portion in which $P^+$-layers are not connected with each other and a portion in which the $P^+$-layers (a $P^+$-substrate for an IGBT) are connected with each other. The first example will be described taking an example of a MOSFET using silicon carbide (SiC) as the semiconductor material and having a device breakdown voltage of 1,200 V, as a vertical planar gate MOSFET.

In FIG. 5, the SiC-MOSFET of the first example uses an N-type SiC semiconductor substrate 1 as the semiconductor substrate. In the first example, the low resistance N-type SiC semiconductor substrate 1 having nitrogen as the impurity at $2 \times 10^{19}$ cm$^{-3}$ can realize the semiconductor substrate according to the present invention.

In the fabrication of the SiC-MOSFET of the first example, an N-type SiC layer 2 including nitrogen at $1.0 \times 10^{16}$ cm$^{-3}$ is first epitaxially grown to have a thickness of about 10 μm on a surface inclined by about four degrees with respect to a surface whose crystallographic plane indices are (000-1) of the N-type SiC semiconductor substrate 1. The N-type SiC layer 2 epitaxially grown on the N-type SiC semiconductor substrate 1 can realize the first semiconductor layer. The N-type SiC layer 2 is formed on a front face of the N-type SiC semiconductor substrate 1.

On the N-type SiC layer (a first semiconductor layer) 2 epitaxially grown on the N-type SiC semiconductor substrate 1, a $P^+$-layer 3 is formed using an ion implantation method. The $P^+$-layer (a second semiconductor layer) 3 is set to have, for example, a width of 13 μm and a depth of 0.5 μm. For forming the $P^+$-layer 3, for example, aluminum is used as the ion. The dose amount is set for the impurity concentration for forming the $P^+$-layer 3 to be $1.0 \times 10^{18}$ cm$^{-3}$.

Figure 1:
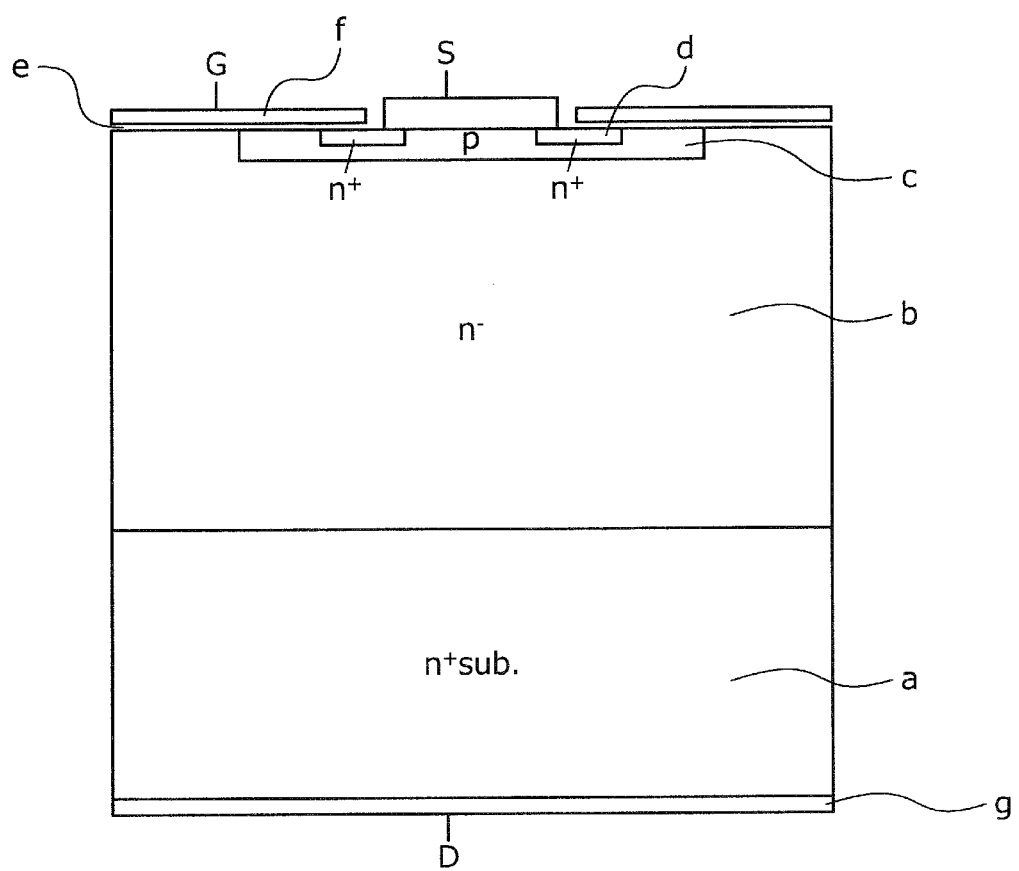
FIG. 1 is an explanatory diagram of a cross-sectional structure of a common MOSFET.
Figure 2:
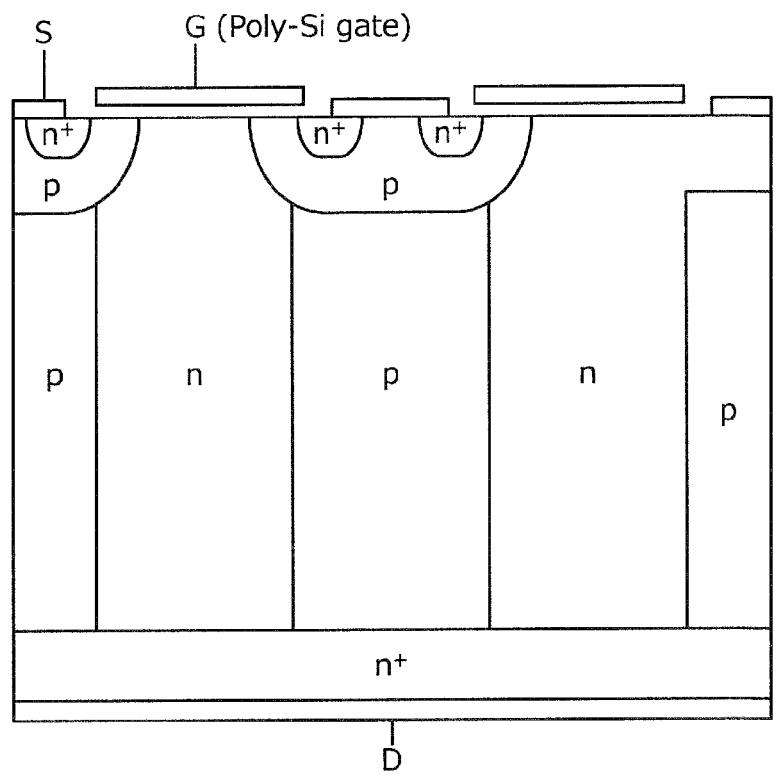
FIG. 2 is an explanatory diagram depicting a cross-sectional view of the structure of a conventional silicon superjunction MOSFET.
Figure 3:
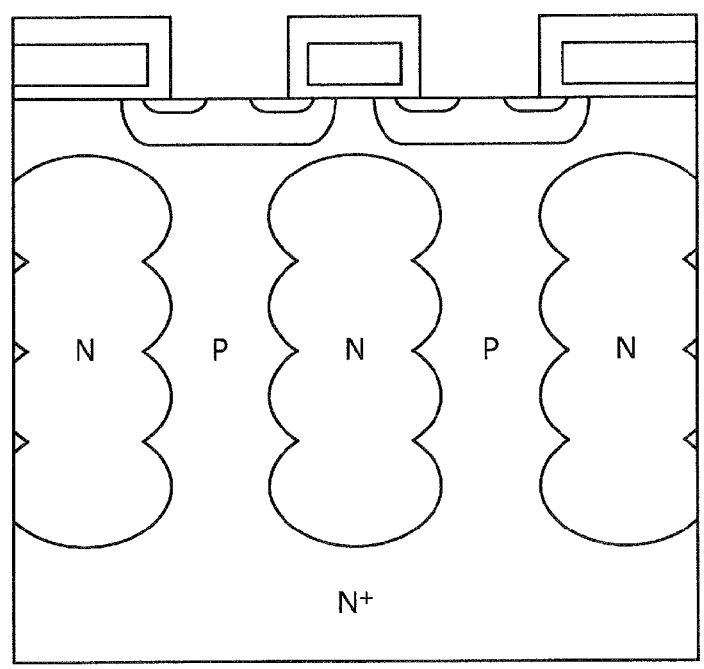
FIG. 3 is an explanatory diagram depicting a cross-sectional view of the structure of a conventional silicon superjunction MOSFET (multi-epi process)
Figure 4:
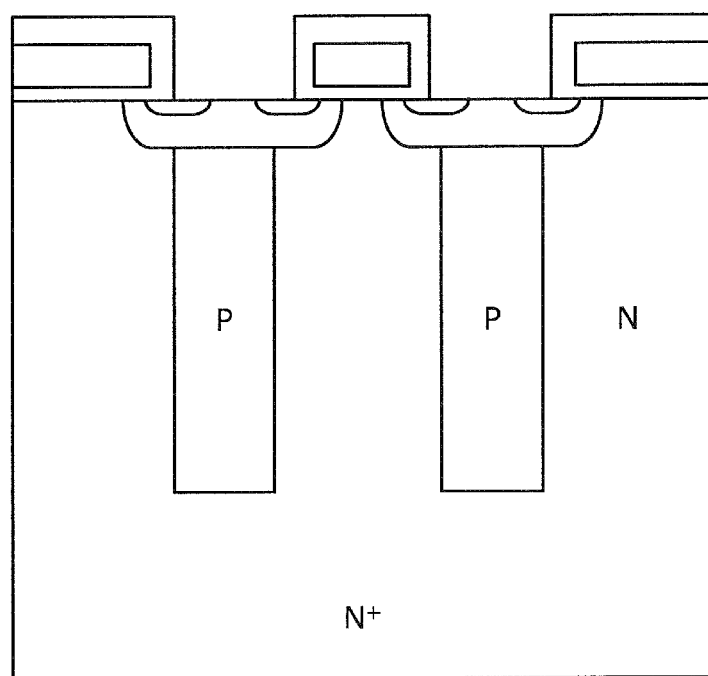
FIG. 4 is an explanatory diagram depicting a cross-sectional view of the structure of a conventional silicon superjunction MOSFET (trench filling process)
Figure 6:
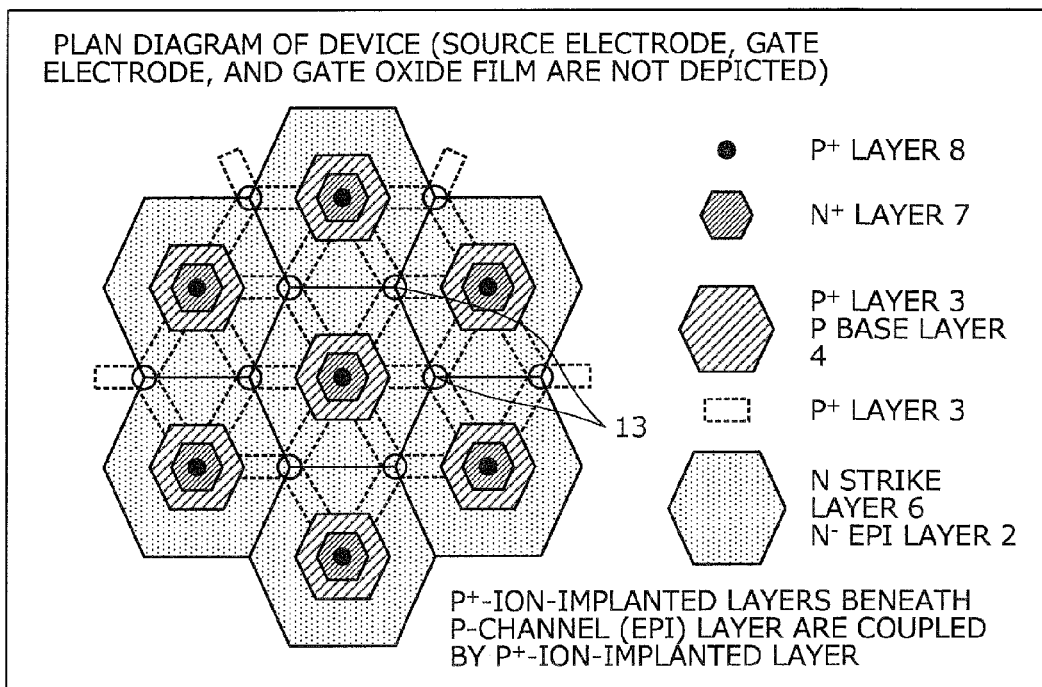
FIG. 6 is a plan diagram of a layout of a $P^+$-layer 3 and cells in the SiC-MOSFET of the first example.

FIG. 6 is a plan diagram of a layout of the $P^+$-layer 3 and cells in the SiC-MOSFET of the first example. In forming the $P^+$-layer 3, portions of the $P^+$-layer 3 are connected with each other by a coupling portion 13 under an N-counter layer 6 described later. The portions of the $P^+$-layer 3 are connected with each other by the coupling portion 13 in portions away from a PN-junctions between a P-base layers 4 layers and the N-counter layers 6 (see FIG. 6). The portions of the $P^+$-layer 3 that are also portions connected with each other in the region under the N-counter layer 6 are separated from the PN-junctions formed by the P-base layers 4 and the N-counter layers 6.

As depicted in FIG. 6, in the first example, a case is described where a hexagonal cell pattern is used in the fabrication. However, use of a square cell pattern, etc., in the formation causes no problem. In the SiC-MOSFET of the first example, the distance is set to be 2 μm between the portions of the $P^+$-layers 3 not connected with each other.

After forming the $P^+$-layer 3, the P-base layer 4 is formed on the $P^+$-layer 3 and the N-type SiC layer 2. The P-base layer 4 is formed using the epitaxial growth method to have a thickness of 0.5 μm. In forming the P-base layer 4, for example, aluminum is used as the impurity and the impurity concentration is set to be $2.0 \times 10^{16}$ cm$^{-3}$. The P-base layer 4 is a layer of the second conductivity type and has an impurity concentration set to be relatively low. The impurity concentration of the P-base layer 4 is set to be lower than the impurity concentration of the $P^+$-layer 3.

Thereafter, an $N^+$-source layer (a first conductivity type source region) 7 and a $P^+$-contact layer 8 are selectively formed as the N-counter layer 6 in the P-base layer 4 by selectively implanting nitrogen ions into the P-base layer 4. The concentration of the nitrogen ions is $5.0 \times 10^{16}$ cm$^{-3}$ and the ions are selectively implanted into the P-base layer 4 to realize a depth of 1.5 μm and a width of 2.0 μm. After selectively forming the $N^+$-source layer 7 and the $P^+$-contact layer 8 in the P-base layer 4, activated annealing therefor is executed. For example, the heat treatment temperature of the activated annealing is set to be 1,620 degrees C. and the heat treatment time period thereof is set to be two minutes.

Figure 7:
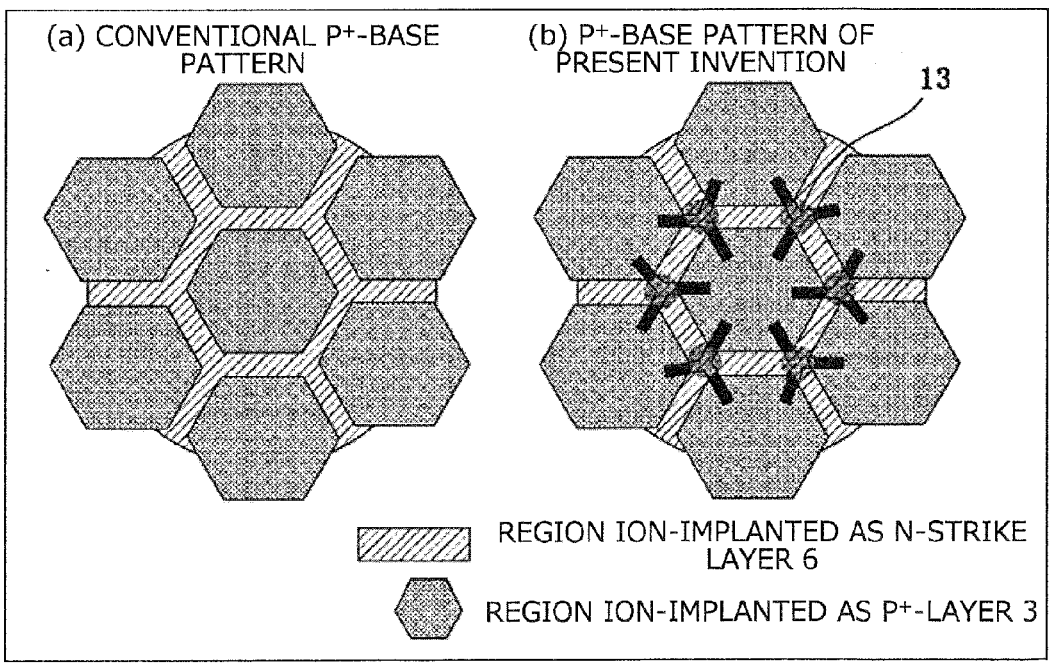
FIG. 7 is an explanatory diagram of a coupling state of the $P^+$-layer of the first example compared to that of a conventional technique.

FIG. 7 is an explanatory diagram of the coupling state of the $P^+$-layer of the first example compared to that of a conventional technique. FIG. 7 depicts regions to be ion-implanted when the N-counter layer 6 are selectively formed in the P-base layer 4, compared to those of the conventional technique. According to the conventional technique, as depicted in (a) of FIG. 7, the $P^+$-layers each being a hexagonal cell are separated from each other. In contrast, in the first example, as depicted in (b) of FIG. 7, each of the $P^+$-layers 3 each being a hexagonal cell is connected with two other adjacent $P^+$-layers 3 at each vertex. In the first example, as depicted in (b) of FIG. 7, aluminum ions are implanted as the $P^+$-layer 3 using a mask with which the $P^+$-layers 3 are connected with each other.

Thereafter, a gate insulating film (an oxide film) 9 having a thickness of 100 nm is formed by thermal oxidation and is annealed at about 1,000 degrees C. in a hydrogen atmosphere. A polycrystalline Si layer doped with phosphorus is formed as a gate electrode 10 and patterning therefor is executed. The gate electrode 10 is disposed through the gate insulating film 9 in at least a portion on an exposed portion of the surface of the P-base layer 4 between the $N^+$-source layer 7 and the N-counter layer 6.

After forming the gate electrode 10, phosphoric glass is deposited as a film having a thickness of 1.0 μm and patterning therefor is executed. Thereafter, heat treatment is executed to form an interlayer insulating film 14. After forming the interlayer insulating film 14, aluminum including 1% of Si is deposited as a metal film having a thickness of 5 μm on the surface of the interlayer insulating film 14 using the sputtering method to form a source electrode 11.

Nickel is deposited as a contact metal film on the back face of the N-type SiC semiconductor substrate 1 and heat treatment therefor is executed at 970 degrees C. Thereafter, Ti/Ni/Au is deposited as a metal film to form a drain electrode 12. Thereafter, the SiC-MOSFET of the first example is completed by applying a passivation film to the surface.

FIG. 8 is an explanatory diagram of a result of evaluated property comparison between the SiC-MOSFET of the example according to the present invention and the conventional SiC-MOSFET whose P+-layers are not connected with each other. FIG. 8 depicts a measurement result of the fabricated SiC-MOSFET as described above. The die size used in the measurement was 3 mm×3 mm, the active area thereof was 5.27 mm$^2$, and the rated current thereof was 25 A.

As depicted in FIG. 8, the SiC-MOSFET of the first example had ON-resistance (RonA) of 2.80 mΩcm$^2$ and this presented a sufficiently low value. The SiC-MOSFET of the first example had the breakdown voltage of 1,450 V and this presented a sufficiently excellent property as a 1,200V rating.

For comparison, a SiC-MOSFET was measured that was produced to have the P+-layers 3 not connected with each other at all. As a result, the ON-resistance thereof was 2.80 mΩcm$^2$ presenting a sufficiently low value similarly to the above although the gate oxide film was damaged when a voltage of 880 V was applied between the source and the drain. From this, it can be seen that the SiC-MOSFET of the first example according to the present invention presented extremely low ON-resistance while maintaining a sufficient breakdown voltage.

According to the present invention, the P-base layers 4 are not connected with each other while the P+-layers 3 are connected with each other. Therefore, the surface accumulation layer remains and as a result, the ON-resistance can be sufficiently reduced. To verify this, a device was fabricated experimentally whose P-base layers 4 not P+-layers 3 were connected with each other, and the properties thereof were evaluated. As a result, the breakdown voltage was 1,440 V and did not vary while the ON-resistance was degraded by about 50% to be 5.0 mΩcm$^2$.

FIG. 9 is an explanatory diagram of a result of actual measurement of the breakdown voltage of the SiC-MOSFET obtained when the width of the N-counter layer 6 was varied. FIG. 9 depicts an actual measurement result of the breakdown voltage of a SiC-MOSFET that was produced for comparison with the SiC-MOSFET in the first example and whose P+-layers 3 were not connected with each other at all and obtained when the width of the N-counter layer 6 was varied. The concentrations and the thicknesses of the layers in each of the devices (the SiC-MOSFETs) were set to be the same as above.

As clearly seen from the result depicted in FIG. 9, the SiC-MOSFET of the first example according to the present invention realized a high breakdown voltage property for a voltage of 1,400V higher and was a sufficient breakdown voltage property as a 1,200V rating. As clearly seen from the result depicted in FIG. 9, the SiC-MOSFET of the first example according to the present invention realized a sufficient breakdown voltage property compared to the SiC-MOSFET that was produced for the comparison and whose P+-layers 3 were not connected with each other at all.

The ON-resistance in this case was the same for both SiC-MOSFETs. The distance between the P+-layers 3 needed to be equal to or shorter than 1.0 μm and the N-counter concentration needed to be reduced to one fifth thereof to satisfy a high breakdown voltage property for a voltage of 1,400 V or higher, equivalent to that of the first example by the SiC-MOSFET used for the comparison. The ON-resistance in this case presented an extremely high value of 10.80 mΩcm$^2$ and it was confirmed that the ON-resistance and the breakdown voltage were simultaneously improved by the first example.

A measurement result of a short-circuit capability of the first example will be described. FIG. 10 is an explanatory diagram of the result of a short-circuit capability of the first example. In the short-circuit capability test, the bias voltage was directly applied between the source and the drain and, in this state, the voltage of Vg=20 V was applied to the gate electrode, and for how many μsec the SiC-MOSFET does not fail is evaluated. The power source bias voltage is set to be Vds=800 V and the temperature for the measurement is set to be 175 degrees C. FIG. 10 is a schematic of a measured waveform in the short-circuit capability. As is clear from the result depicted in FIG. 10, the device presented a sufficient property in that the SiC-MOSFET did not fail even with the highest current of 250 A conducted therethrough, which was five times higher than the rated current and did not fail even for 15 μsec.

Figure 11:
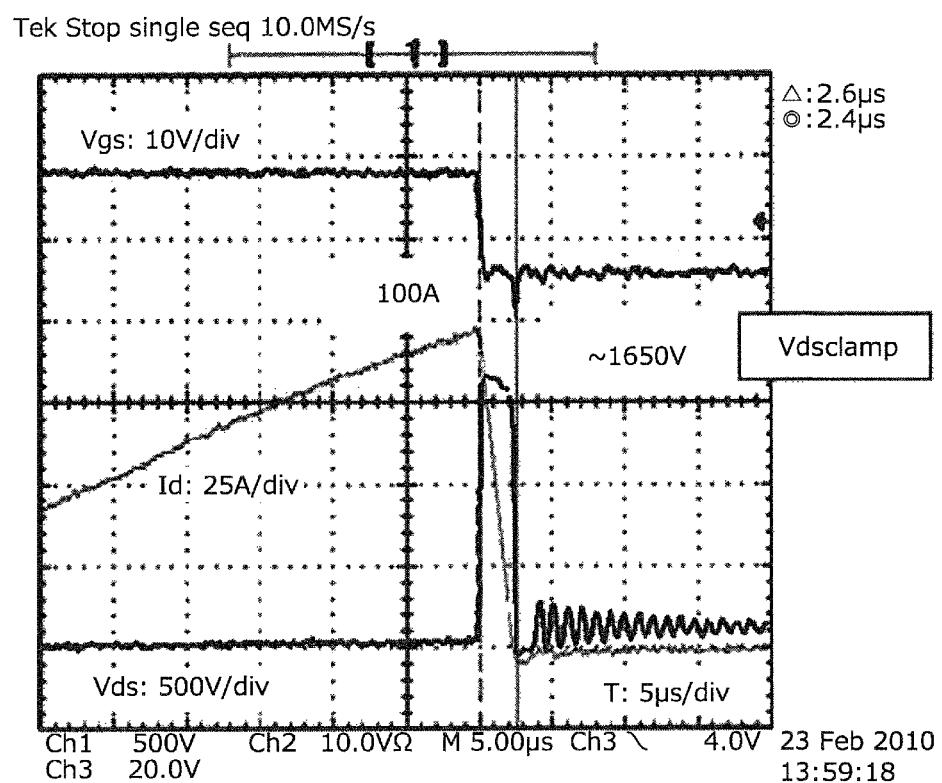
FIG. 11 is an explanatory diagram of a result of a turn-off failure resistance level evaluation of the SiC-MOSFET of the first example.

FIG. 11 is an explanatory diagram of a measurement result of a turn-off capability of the SiC-MOSFET of the first example. When the turn-off capability of the SiC-MOSFET of the first example was evaluated, as depicted in FIG. 11, the voltage between the source and the drain was clamped at 1,650 V (Vdsclamp in FIG. 11) and it was confirmed that a current of 100 A (a current four times as high as the rated current) was able to be turned off at 150 degrees C. without any failure. From this, it can be said that the SiC-MOSFET of the first example according to the present invention is a device that realizes a low ON-resistance, and whose short-circuit capability and whose turn-off capability are extremely high.

The withstand capabilities of the SiC-MOSFET produced for comparison were evaluated and, as depicted in FIG. 8, the breakdown voltage was not sufficient and therefore, as a result, both the short-circuit capability and the turn-off capability were significantly degraded compared to those of the device of the first example.

The evaluation was also executed for devices produced by similarly depositing films on surfaces inclined by zero degrees, two degrees, eight degrees, and 10 degrees with respect to a surface whose crystallographic plane indices were (000-1) of the N-type SiC semiconductor substrate 1. As a result, the properties did not substantially vary and were excellent.

Figure 13A:
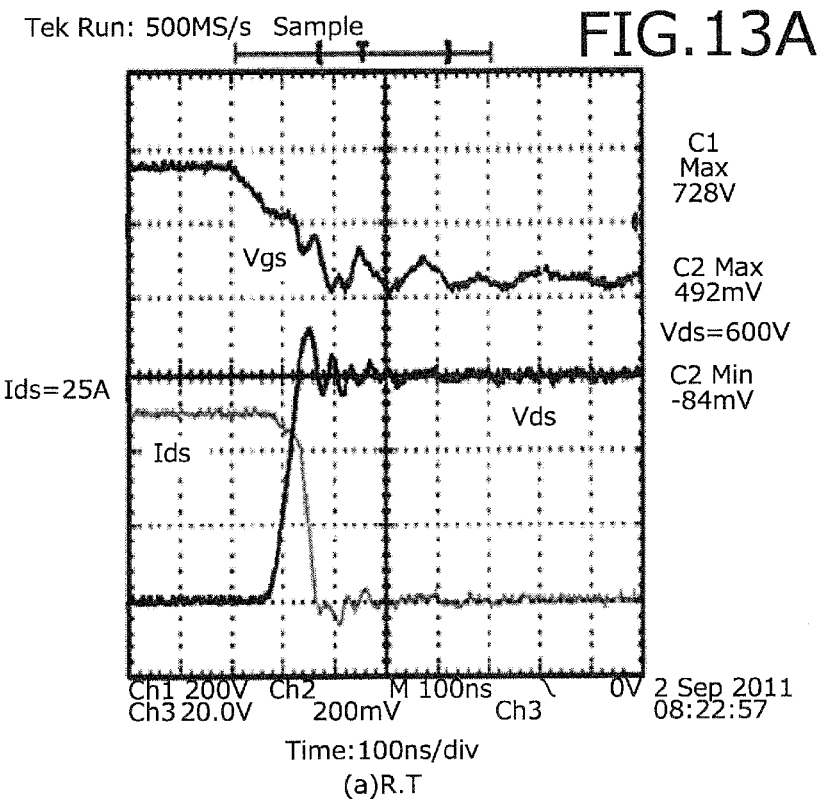
FIGS. 13A and 13B are explanatory diagrams of a turn-off switching waveform of the SiC-MOSFET of the first example.
Figure 13B:
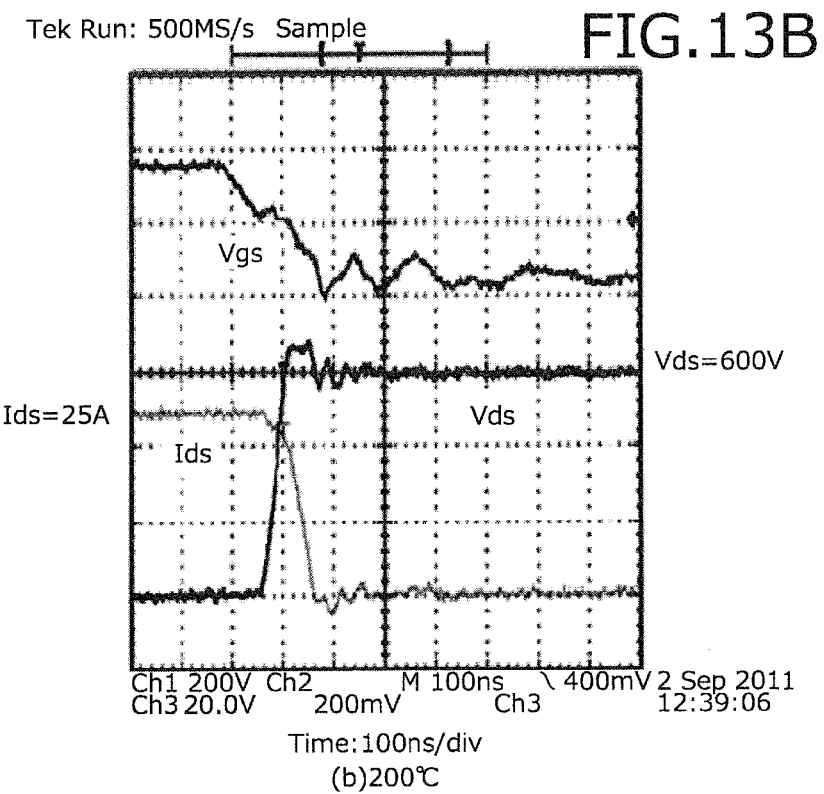
Figure 14A:
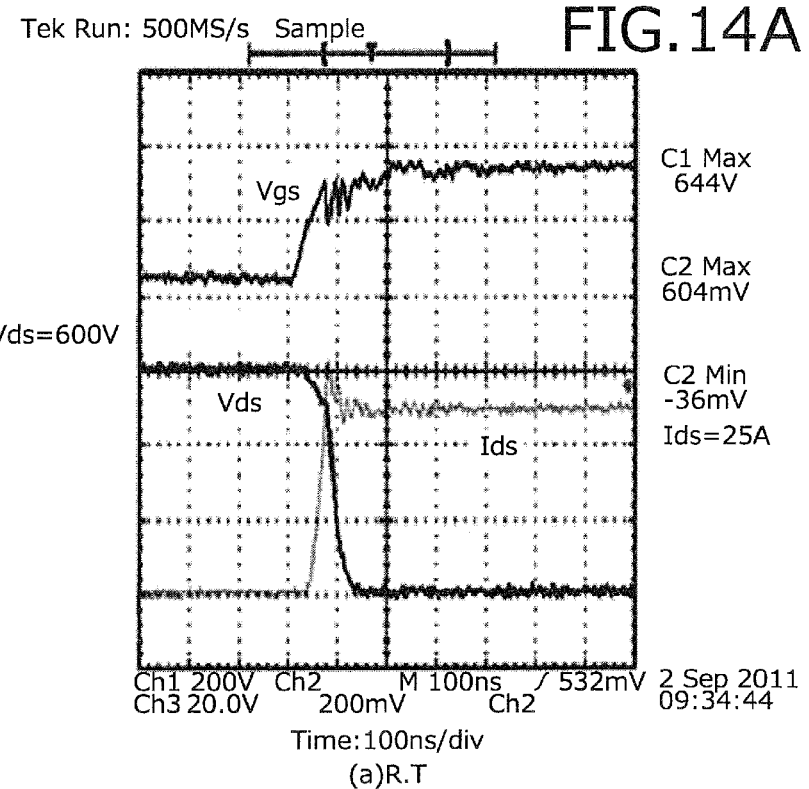
FIGS. 14A and 14B are explanatory diagrams of a turn-on switching waveform of the SiC-MOSFET of the first example.
Figure 14B:
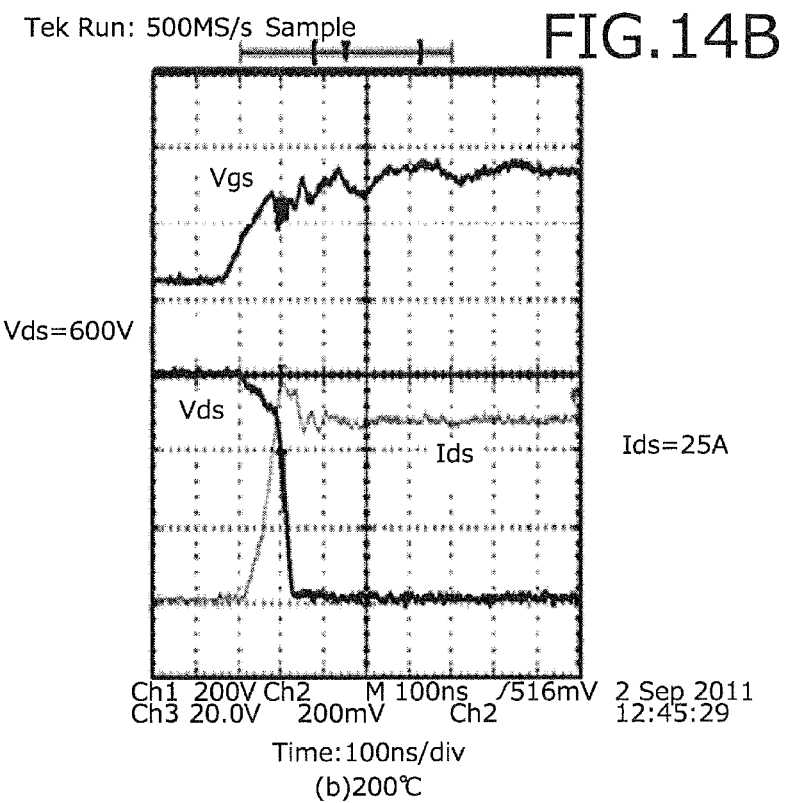

FIGS. 13A and 13B are explanatory diagrams of a turn-off switching waveform of the SiC-MOSFET of the first example, and FIG. 13A depicts a result of the measurement in a room temperature state and FIG. 13B depicts a result of the measurement at 200 degrees C. FIGS. 14A and 14B are explanatory diagrams of a turn-on switching waveform of the SiC-MOSFET of the first example, and FIG. 14A depicts a result of the measurement in a room temperature state and FIG. 14B depicts a result of the measurement at 200 degrees C.

Second Example

A second example according to the present invention will be described. The second example will be described taking an example of a 1,200V/25 A MOSFET fabricated according to the same fabrication process as that of the first example. In the second example, the N-type SiC layer 2 including nitrogen at about 1.8×10$^{16}$ cm$^{-3}$ is epitaxially grown to have a thickness of about 10 μm on a surface inclined by about four degrees with respect to a surface whose crystallographic plane indices were (0001) of the N-type SiC semiconductor substrate 1. In the second example, the processes and the cell structure forming the components other than the N-type SiC layer 2 are all the same as those of the first example and will not again be described.

As clearly seen from the result depicted in FIG. 8, the ON-resistance of the SiC-MOSFET of the second example was increased by about 55% compared to the ON-resistance of the SiC-MOSFET of the first example while the ON-resistance of the second example presented a sufficiently low ON-resistance to the common SiC-MOSFET. The evaluation was also executed for devices produced by similarly depositing films on surfaces inclined by zero degrees, two degrees, eight degrees, and 10 degrees with respect to a surface whose crystallographic plane indices were (0001) of the N-type SiC semiconductor substrate 1. As a result, the properties did not substantially vary and were excellent.

Third Example

A third example according to the present invention will be described. The third example will be described taking an example of a 1,200V/25 A MOSFET fabricated according to the same fabrication process as that of the first example. In the third example, the N-type SiC layer 2 including nitrogen at about $1.8 \times 10^{16}$ cm$^{-3}$ is epitaxially grown to have a thickness of about 10 μm on a surface inclined by about four degrees with respect to the surface whose crystallographic plane indices were (000-1) of the N-type SiC semiconductor substrate 1.

Figure 12:
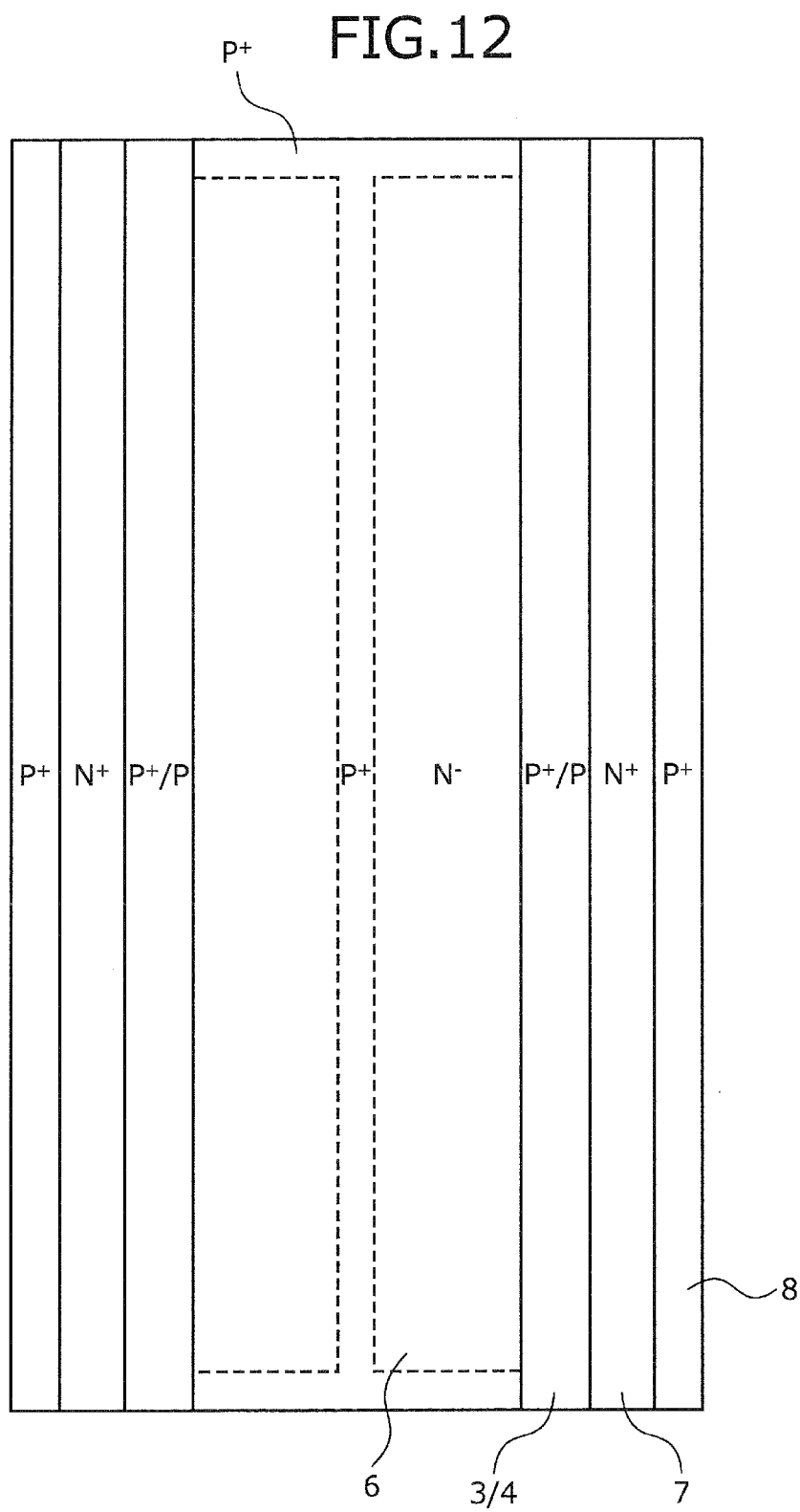
FIG. 12 is a plan diagram of a layout of the $P^+$-layer 3 and the cells of the SiC-MOSFET of a third example.

FIG. 12 is a plan view of a layout of the P$^+$-layer 3 and the cells of the SiC-MOSFET of the third example. In the third example, the N-type SiC layer 2 is designed in a stripe cell pattern. Therefore, the P$^+$-layers 3 are disposed to couple the P$^+$-layers 3 with each other using the structure as depicted in FIG. 12. The P$^+$-layers 3 are connected with each other under the N-counter layer 6 and the P-base layer 4. In the third example, the process steps to form the components other than the N-type SiC layer 2 are all the same as those in the first and the second examples, and will not again be described.

As clearly seen from the result depicted in FIG. 8, the On-resistance of the SiC-MOSFET of the third example is increased by about 10% compared to that of the SiC-MOSFET of the first example while the SiC-MOSFET presents a sufficiently low ON-resistance property and a high breakdown voltage to the common SiC-MOSFET.

Fourth Example

A fourth example according to the present invention will be described. In the fourth example, an N-type SiC semiconductor substrate is prepared as the semiconductor substrate 1. In the fourth example, a low resistivity N-type SiC semiconductor substrate 1 including nitrogen as the impurity at about $2 \times 10^{19}$ cm$^{-3}$ is used as the semiconductor substrate. In the fourth example, for example, an N-type SiC layer 2 including nitrogen at about $1.8 \times 10^{16}$ cm$^{-3}$ is epitaxially grown to have a thickness of about 10 μm on a surface inclined by about four degrees with respect to a surface whose crystallographic plane indices are (000-1) of the N-type SiC semiconductor substrate 1.

The P$^+$-layer (the second semiconductor layer) 3 is formed using an epitaxial method on the N-type SiC layer 2 epitaxially grown on the N-type SiC semiconductor substrate 1. The P$^+$-layer 3 has, for example, a width of 13 μm and a depth of 0.5 μm. In forming the P$^+$-layer 3, for example, aluminum is used as the impurity ion. The dose amount is set for an impurity concentration to form the P$^+$-layer 3 to be $1.0 \times 10^{18}$ cm$^{-3}$.

In forming the N-counter layer 6, similar to the first example, portions of the p$^+$-layer 3 are set to be connected with each other (see FIG. 6). Although a hexagonal cell pattern is used in the fabrication in this example, square cells cause no problem. The distance between the P$^+$-layers 3 not connected with each other is set to be, for example, 2 μm.

After forming the P$^+$-layer 3, the P-base layer 4 is formed on the P$^+$-layer 3 and the N-type SiC layer 2. The P-base layer 4 is formed by an epitaxial growth method, to have a thickness of 0.5 μm. Aluminum is used as the impurity for forming the P-base layer 4 and the impurity concentration is set to be $2.0 \times 10^{16}$ cm$^{-3}$.

Thereafter, as the N-counter layer 6, the N$^+$-source layer 7 and the P$^+$-contact layer 8 are selectively formed in the P-base layer 4 by selectively implanting nitrogen ions into the P-base layer 4. The concentration, the thickness, and the width of the N-counter layer 6 are set to be equal to those of the first example. After selectively forming the N$^+$-source layer 7 and the P$^+$-contact layer 8 in the P-base layer 4, activated annealing therefor is executed. For example, the heat treatment temperature of the activated annealing is set to be 1,620 degrees C. and the heat treatment time period is set to be two minutes.

Thereafter, the gate insulating film 9 having a thickness of 100 nm is formed by heat oxidation and is annealed in a hydrogen atmosphere at about 1,000 degrees C. A polycrystalline Si layer doped with phosphorus is formed as the gate electrode 10 and patterning therefor is executed. The gate electrode 10 is disposed through the gate insulating film 9 in at least a portion in the exposed portion of the surface of the P-base layer 4 between the N$^+$-source layer 7 and the N-counter layer 6.

After forming the gate electrode 10, phosphoric glass is deposited as an interlayer insulating film having a thickness of 1.0 μm and patterning therefor is executed. Thereafter, heat treatment is executed to form the interlayer insulating film 14. After forming the interlayer insulating film 14, aluminum including 1% of Si is deposited as a metal film having a thickness of 5 μm on the surface using a sputtering method to form the source electrode 11.

Nickel is deposited as a contact metal film on the back face of the N-type SiC semiconductor substrate 1 and heat treatment therefor is executed at 970 degrees C. Thereafter, Ti/Ni/Au is deposited as a metal film to form the drain electrode 12. Thereafter, the SiC-MOSFET of the fourth example is completed after applying a passivation film on the front face.

As is clear from the measurement result shown in a table depicted in FIG. 8, as the electric properties of the SiC-MOSFET of the fourth example fabrication as above, the ON-resistance (RonA) presented a sufficiently low value that is 2.85 mΩcm$^2$. The SiC-MOSFET of the fourth example presented the breakdown voltage of 1,455 V and presented a sufficiently excellent property as a 1,200V rating.

The evaluation was also executed for devices fabricated by similarly forming films on surfaces inclined by zero degrees, two degrees, eight degrees, and 10 degrees with respect to the surface whose crystallographic plane indices were (000-1) of the N-type semiconductor substrate 1. As a result, the properties did not substantially vary and were excellent. The die size was 3 mm×3 mm. The active area was 5.27 mm$^2$. The rated current was 25 A.

Fifth Example

A fifth example according to the present invention will be described. The fifth example will be described taking an example of a 1,200V/25 A MOSFET fabricated according to the same fabrication process as that of the fourth example. In the fifth example, the N-type SiC layer 2 including nitrogen at about $1.8 \times 10^{16}$ cm$^{-3}$ is epitaxially grown to have a thickness of about 10 μm on a surface inclined by about four degrees with respect to a surface whose crystallographic plane indices are (0001) of the N-type semiconductor substrate 1. Other process steps are all the same as those of the fourth example.

As clearly seen from the result depicted in FIG. 8, the ON-resistance of the SiC-MOSFET of the fifth example was increased by about 50% relative to the ON-resistance of the SiC-MOSFET of the fourth example while the ON-resistance of the fifth example presented a sufficiently low ON-resistance compared to the common SiC-MOSFET. The evaluation was also executed for the devices fabricated by similarly depositing films on surfaces inclined by zero degrees, two degrees, eight degrees, and 10 degrees with respect to a surface whose crystallographic plane indices were (0001) of the N-type SiC semiconductor substrate 1. As a result, the properties did not substantially vary and were excellent.

The evaluation was executed on the switching loss of the SiC-MOSFET produced in each of the first to the fifth examples. As a result, it was confirmed that, as depicted in FIG. 8, the total loss of the turn-on loss and the turn-off of each SiC-MOS was reduced by 60% or higher compared to that of the same rated Si-IGBT (1,200V/25 A).

In the first to the fifth examples, examples have been described where the present invention is applied to the MOSFETs (SiC-MOSFETs). However, the present invention is not limited to an application to the MOSFET. The present invention is further applicable to an IGBT using a semiconductor substrate of a conductivity type different from that of the MOSFET. Although the first conductivity type is set to be the N type and the second conductivity type is set to be the P type in each of the examples, the present invention is also realized when the first conductivity type is set to be the P type and the second conductivity type is set to be the N type.

As described, the MOSFET of the present invention is a SiC-MOSFET as the vertical high voltage semiconductor apparatus including the N-type SiC semiconductor substrate 1 as the first conductivity type semiconductor substrate, the N-type SiC layer 2 as the first semiconductor layer that is of the first conductivity type and formed on the N-type SiC semiconductor substrate 1 and whose impurity concentration is lower than that of the N-type SiC semiconductor substrate 1, the P$^+$-layer 3 as the second semiconductor layer that is of the second conductivity type and selectively formed on the surface of the N-type SiC layer 2 and whose impurity concentration is higher than that of the N-type SiC layer 2, the P-base layer 4 as the second conductivity type base layer disposed on the N-type SiC layer 2 and the P$^+$-layer 3, the N$^+$-source layer 7 as the first conductivity type source region selectively formed in the surface layer of the P-base layer 4, the first conductivity type N-counter layer 6 formed to penetrate the P-base layer 4 from the surface and reach the N-type SiC layer 2, the gate electrode 10 as the gate electrode layer disposed through the gate insulating film 9 in at least the portion in the exposed portion of the surface of the P-base layer 4 between the N$^+$-source layer 7 and the N-counter layer 6, the source electrode 11 in contact commonly with the surfaces of the N$^+$-source layer 7 and the P-base layer 4, and the drain electrode 12 disposed on the back face of the N-type SiC semiconductor substrate 1, and is characterized in that the portions of the P$^+$-layer 3 are connected with each other in the region under the N-counter layer 6.

According to the SiC-MOSFET of the examples according to the present invention, even in a case where the impurity concentration of the region for the N-type SiC layer 2 and the N-counter layer 6 is significantly increased and thereby, the ON-resistance is sufficiently reduced, or even in a case where the distances between the P$^+$-layers 3 and between the P-base layers 4 are increased and thereby, the ON-resistance is sufficiently reduced, when high voltage is applied between the source and the drain (the source is at zero V and positive voltage is applied to the drain), no high electric field is applied to the gate insulating film 9 on the N-counter layer region 6. Thereby, a sufficient breakdown voltage can be maintained. This is because the depletion layer tends to be expanded in the horizontal direction along the P$^+$-layer 3.

As a result, the device is designed such that the depletion layer tends to be expanded even when the impurity concentrations of the region for the N-type SiC layer 2 and the N-counter layer 6 is set to be higher than that of the conventional MOSFET and therefore, the ON-resistance can be reduced maintaining the sufficient breakdown voltage by increasing the distances between the P$^+$-layers 3 and between the P-base layers 4.

As described, according to the SiC-MOSFET (or the IGBT structure) of the examples according to the present invention, the vertical SiC-MOSFET that uses SiC as the semiconductor material, utilizes the low ON-resistance and the reliability thereof can be improved by preventing the failure of the oxide film forming the gate electrode 10 even when high voltage is applied thereto.

When the P-base layer 4 of the examples according to the present invention is formed using an epitaxial growth method, the surface can be made flat substantially without any roughness and therefore, the mobility in the MOSFET portion of the surface is significantly increased. As a result, the ON-resistance can further be reduced.

When the semiconductor material is silicon carbide, by setting a surface to be parallel to (or inclined by an angle within 10 degrees respect thereto) a surface of the N-type SiC semiconductor substrate 1 whose crystallographic plane indices are (000-1), or by setting a surface to be parallel to (or inclined by an angle within 10 degrees respect thereto) a surface of the N-type SiC semiconductor substrate 1 whose crystallographic plane indices are (0001), the interface state density can be reduced of the interface between the gate insulating film 9 and the semiconductor and therefore, the mobility in the MOSFET portion can further be improved. As a result, the ON-resistance can extremely be reduced.

As described, according to the present invention, merely changing the mask when the P$^+$-layer 3 is formed on the surface of the first semiconductor layer 2 by ion-implantation enables the portions of the P$^+$-layer 3 that is the second semiconductor layer to be connected with each other. Thereby, it can be expected that the device is widely employed as a MOSFET and an IGBT capable of having a high withstanding capability with a low ON-resistance and a high speed switching, maintaining a sufficient breakdown voltage regardless of the crystal plane direction of the substrate without generating any increase of the cost. The examples can be similarly realized when the conductivity type (the N type or the P type) of each of the semiconductor layers or the semiconductor regions is reversed.

The examples have been described assuming that the device is a MOSFET whose semiconductor substrate is of the N type. However, the same effect is also achieved for an IGBT. When the present invention is applied to an IGBT, a P-type collector layer is merely formed on the back face of the substrate using a technique such as epitaxial growth or ion implantation. When the MOSFET of the present invention is applied to the IGBT, the conductivity type of the N-type SiC semiconductor substrate 1 as the semiconductor substrate is merely changed from the N type to the P type, or the P-type collector layer is merely formed on the back face of the N-type substrate. According to the SiC-MOSFET (or the IGBT structure) of the examples according to the present invention, the vertical MOSFET, the IGBT structure, and a simple fabrication method thereof can be provided.

INDUSTRIAL APPLICABILITY

As described, the vertical high voltage semiconductor apparatus and the fabrication method of the vertical high voltage semiconductor apparatus according to the present invention are useful for a power semiconductor apparatus used in a power conversion equipment such as a motor control inverter or an uninterruptible power supply (UPS).

EXPLANATIONS OF LETTERS OR NUMERALS 1 semiconductor substrate
2 first semiconductor layer
3 P$^+$-layer
4 P-base layer
6 N-counter layer
7 N$^+$-source layer
8 P$^+$-contact layer
9 gate insulating film
10 gate electrode
11 source electrode
12 drain electrode
13 coupling portion

The invention claimed is:
1. A vertical high voltage semiconductor apparatus comprising:
   a semiconductor substrate of a first conductivity type;
   a first semiconductor layer of the first conductivity type, formed on the semiconductor substrate and having an impurity concentration lower than that of the semiconductor substrate;
   a second semiconductor layer of a second conductivity type, selectively formed on a surface of the first semiconductor layer and having an impurity concentration higher than that of the first semiconductor layer;
   a base layer of the second conductivity type disposed on the first semiconductor layer and the second semiconductor layer;
   a first conductivity type source region selectively formed in a surface layer of the base layer;
   a second conductivity type contact region selectively formed in the surface layer of the base layer;
   an N-counter layer of the first conductivity type formed to penetrate the base layer from a surface and reach the first semiconductor layer;
   a gate electrode layer disposed through a gate insulating film in at least a portion of an exposed portion of a surface of the base layer between the source region and the N-counter layer;
   a source electrode in contact commonly with surfaces of the source region and the base layer; and
   a drain electrode disposed on a back face of the semiconductor substrate, wherein
   portions of the second semiconductor layer are directly connected with each other in regions beneath the N-counter layer.

2. The vertical high voltage semiconductor apparatus according to claim 1, wherein
   each of said portions of the second semiconductor layer connected with each other in the regions beneath the N-counter layers are separated from respective PN-junctions formed by respective portions of the base layer and respective portions of the N-counter layer.

3. The vertical high voltage semiconductor apparatus according to claim 1, wherein
   a semiconductor material of the semiconductor substrate is silicon carbide.

4. The vertical high voltage semiconductor apparatus according to claim 3, wherein
   the crystallographic plane indices of the semiconductor substrate is a surface parallel to, or inclined by an angle within 10 degrees with respect thereto, a surface whose crystallographic plane indices are (000-1).

5. The vertical high voltage semiconductor apparatus according to claim 3, wherein
   the crystallographic plane indices of the semiconductor substrate is a surface parallel to, or inclined by an angle within 10 degrees with respect thereto, a surface whose crystallographic plane indices are (0001).

6. The vertical high voltage semiconductor apparatus according to claim 2, wherein
   a semiconductor material of the semiconductor substrate is silicon carbide.

7. The vertical high voltage semiconductor apparatus according to claim 6, wherein
   the crystallographic plane indices of the semiconductor substrate is a surface parallel to, or inclined by an angle within 10 degrees with respect thereto, a surface whose crystallographic plane indices are (000-1).

8. The vertical high voltage semiconductor apparatus according to claim 6, wherein
   the crystallographic plane indices of the semiconductor substrate is a surface parallel to, or inclined by an angle within 10 degrees with respect thereto, a surface whose crystallographic plane indices are (0001).

9. The vertical high voltage semiconductor apparatus according to claim 1, wherein the semiconductor substrate is doped with a nitrogen impurity at a concentration of about $2\times10^{19}$ cm$^{-3}$.

* * * * *